United States Patent [19]

Tomuro

[11]  4,427,901
[45]  Jan. 24, 1984

[54] WAVEFORM SHAPING CIRCUIT

[75] Inventor: Yasuta Tomuro, Kawanishi, Japan

[73] Assignee: Mitsubishi Denki Kabushiki Kaisha, Tokyo, Japan

[21] Appl. No.: 315,648

[22] Filed: Oct. 27, 1981

[30] Foreign Application Priority Data

Nov. 8, 1980 [JP] Japan ................... 55-158372

[51] Int. Cl.³ .................... H03K 3/017; H03K 3/02
[52] U.S. Cl. .................... 307/268; 307/261;
  307/356; 328/34; 328/58
[58] Field of Search .............. 307/261, 265, 266, 267,
  307/268, 269, 358, 360, 595, 597, 355, 356, 601,
  603, 608, 228; 328/147, 36, 58, 59, 34

[56] References Cited
U.S. PATENT DOCUMENTS 4,276,860  7/1981  Capurka ..................... 307/228
4,359,649  11/1982 Mündel ..................... 307/268

OTHER PUBLICATIONS

Harvely Scherr "Output Comparator Enhances Versatility of One-Shot" Electronics, May 22, 1972, p. 98.

Primary Examiner—John Zazworsky
Attorney, Agent, or Firm—Wenderoth, Lind & Ponack

[57] ABSTRACT

A waveform shaping circuit which includes a voltage comparator having one input which is supplied with a reference voltage whose amplitude is determined by two voltage dividing resistors which are serially interconnected across a source voltage and having its other input supplied with a voltage across a capacitor which is charged with the source voltage in the absence of a square input pulse and which is discharged in the presence of the input pulse. In order to vary the reference voltage in the presence of the input pulse, a resistor and an NPN common emitter transistor are connected across that voltage dividing resistor which is directly connected to ground and the input pulse is supplied to the base electrode of the transistor.

2 Claims, 3 Drawing Figures

WAVEFORM SHAPING CIRCUIT

BACKGROUND OF THE INVENTION

This invention relates to a waveform shaping circuits used in the pulse generator circuit provided in all the fields of television transmitters and receivers, other video equipment, sequence controllers, etc.

A conventional waveform shaping circuit of the type referred to has comprised a voltage comparator having a negative input which is supplied with a reference voltage developed at a junction of two voltage dividing resistors which are serially connected across a source voltage and having a positive input which connected to capacitor which is charged by the source voltage through a charging resistor. The capacitor is connected via a discharging resistor to a collector electrode of an NPN type common emitter transistor having a base electrode which is connected to an input terminal through a base resistor.

A train of square input pulses is supplied to the input terminal so as to repeat the turn-on and -off of the transistor in an alternating manner. During the turn-off of the transistor, the capacitor is exponentially charged by the source voltage until one of the input pulses is supplied to the transistor so to turn the transistor on, thereby initiating the discharge of the capacitor. During the turn-on of the transistor, the voltage on the capacitor is exponentially discharged until that input pulse terminates so as to turn off the transistor. The voltage on the capacitor thus charged and discharged is supplied to a voltage comparator where it is compared with the reference voltage. The voltage comparator is responsive to a voltage on the capacitor which is equal to the reference voltage so as to produce a rising edge of a square output pulse at the output thereof and is also responsive to a voltage on the capacitor which is equal to the reference voltage so as to produce a falling edge of the square output pulse at the output thereof. Thus, the voltage comparator produces a square output pulse having a pulse width corresponding to a time interval for which the voltage on the capacitor is not less than the reference voltage.

The process as described above is repeated with each of the successive input pulses thereby resulting in a train of square output pulses.

Each of the square output pulses thus produced has rising and falling edges which are bilaterally unsymmetrical with respect to a time point where the rising edge of the square input pulse is developed. This is true in the case where the square output pulses are produced about the falling edges of the input pulses. In the conventional waveform shaping circuit, a time interval between the rising edge of the output pulse and the rising or falling edge of the input pulse is generally longer than that between the rising or falling edge of the input pulse and the falling edge of the output pulse.

Therefore, conventional waveform shaping circuits such as described above have been disadvantageous in that the square output pulse cannot be produced at the desired timing.

It has been possible to eliminate the disadvantage as described above by using a constant current circuit with each of the charging and discharging circuits for the capacitor. However, this measure has increased a change in the pulse width of the output pulse relative to a variation in source voltage.

Accordingly, it is an object of the present invention to provide a new and improved waveform shaping circuit for producing an output square pulse having a pulse width on each side of a rising or a falling edge of a square input pulse which is capable of being selected at will and is free from any change relative to a variation in the source voltage.

SUMMARY OF THE INVENTION

The present invention provides a waveform shaping circuit comprising a voltage comparator having a pair of inputs, one of the inputs being supplied with a reference voltage, the other of the inputs being supplied with a voltage across a capacitor which is charged in the absence of a square input pulse and which is discharged in the presence of the square input pulse so as to thereby produce a square output pulse from the voltage comparator, and further comprising a means which is responsive to the square input pulse to vary the reference voltage.

In the preferred embodiment of the present invention, said means for varying the reference voltage includes a resistor which is connected to the junction of two voltage dividing resistors which are serially interconnected across a source voltage so as to determine the reference voltage, and includes a transistor having an emitter electrode which is connected to ground, a collector electrode which is connected to the firstmentioned resistor and a base electrode which is supplied with the square input pulse.

BRIEF DESCRIPTION OF THE DRAWING

The present invention will become more readily apparent from the following detailed description taken in conjunction with the accompanying drawing in which.

DESCRIPTION OF THE PREFERRED EMBODIMENTS

Figure 1:
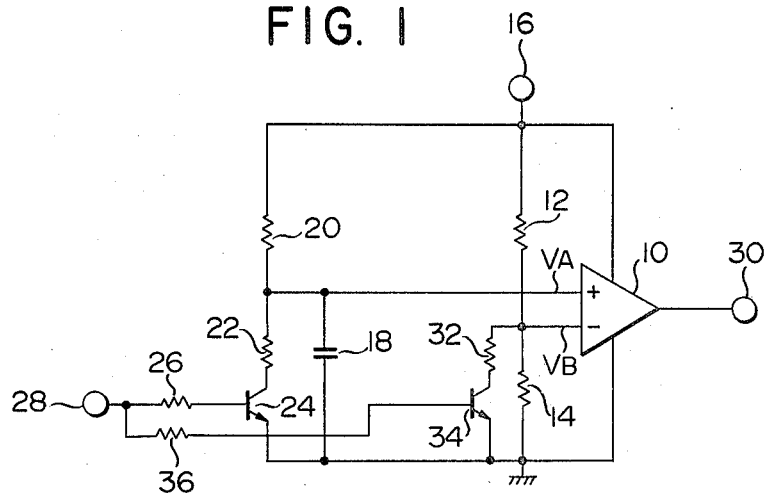
FIG. 1 is a circuit diagram of one embodiment according to the waveform shaping circuit of the present invention.

Referring now to FIG. 1 of the drawings, there is illustrated one embodiment according to the waveform shaping circuit of the present invention. The illustrated arrangement comprises a voltage comparator 10 having a negative input which is connected to the junction of two voltage dividing resistors 12 and 14 which are serially interconnected between a source terminal 16 and ground and having a positive input which is connected to the junction of a capacitor 18 and a charging resistor 20 which is serially interconnected between the source terminal 16 and ground, and which is also connected to a discharging resistor 24 which has one end connected to the junction of the capacitor 18 and the resistor 20. The discharging resistor 22 has its other end connected to a collector electrode of an NPN type common emitter transistor 24 having a base electrode which is connected via a base resistor 26 to an input terminal 28. The output of the voltage comparator 10 is connected to an output terminal 30 and the comparator is also connected between the source terminal 16 and ground.

The junction of the serially connected resistors 12 and 14 has developed thereat a reference voltage $V_B$ for the voltage comparator 10. The charging resistor 20 along with the capacitor 18 determines a charging time constant upon the charging of the capacitor 18 while the discharging resistor 22 along with the capacitor 18 determines a discharging time constant upon the discharging of the capacitor 18.

That portion of the arrangement described above is of the conventional structure.

According to the present invention, another voltage dividing resistor 32 is serially connected to a collector electrode of another NPN type common emitter transistor 34 which is connected across the voltage dividing resistor 14 and ground, and the transistor 34 has its base electrode connected to the input terminal 28 through another base resistor 36.

Figure 2:
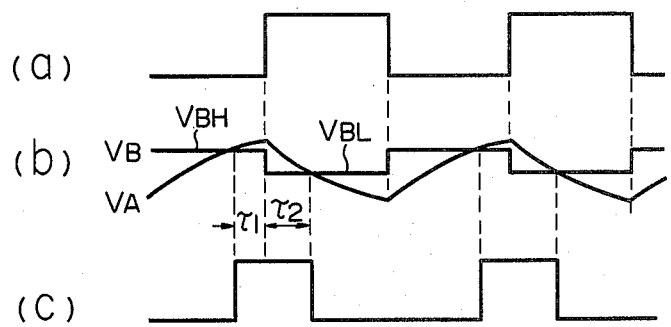
FIG. 2 is a graph illustrating waveforms developed at various points in the arrangement shown in FIG. 1.

The operation of the arrangement shown in FIG. 1 will now be described in conjunction with FIG. 2 wherein there are illustrated waveforms developed at various points in the arrangement. When a train of square input pulses as shown at waveform (a) in FIG. 2 is supplied to the input terminal 28, the transistors 24 and 34 are repeatedly turned on and off in an alternating manner. During the turn-off of the transistor 34, the capacitor 18 is exponentially charged by the source voltage through the source terminal 16 and during the turn-off of the transistor 34, the negative input of the voltage comparator 10 is supplied with the reference voltage $V_B$ at its high level $V_{BH}$, FIG. 2) as determined by the voltage dividing resistors 12 and 14 because the resistor 32 is not actually connected across the resistor 14. One of the square input pulses is respectively supplied to the transistors 24 and 34 through the base resistors 26 and 36.

Therefore, the transistor 24 is turned on to initiate the discharging of the capacitor 18. This discharge of the capacitor 18 continues during the turn-on of the transistor 24 or for a pulse width equal to that of the square pulse. The transistor 34 is also simultaneously turned on so as to connect the resistor 32 across the resistor 14 so as to decrease the reference voltage $V_B$ supplied to the voltage comparator 10 to its low level $V_{BL}$ (see waveform (b) labelled $V_{BL}$, FIG. 2).

A voltage $V_A$ across the capacitor 18 thus charged and discharged as shown at waveform (b) labelled $V_A$ in FIG. 2 is supplied to the positive input of the voltage comparator 10 where it is compared with the reference voltage $V_B$ which is supplied to the negative input thereof. The voltage comparator 10 responds to a voltage across the capacitor 18 which is equal to the reference voltage $V_B$ at its high level $V_{BH}$ so as to initiate the generation of a square output pulse at the output thereof and therefore at the output terminal 30 and also responds to a voltage across the capacitor 18 which is equal to the voltage $V_B$ at the low level $V_{BL}$ so as to terminate the square output pulse as shown at waveform (c) in FIG. 2.

The process as described above is repeated with each of the succeeding square input pulses so as to generate a train of square output pulses as shown at waveform (c) in FIG. 2.

In the illustrated example the square output pulse has a pulse width corresponding to a time interval which is equal to the sum of a time interval $\tau_1$ between a time point where the charged voltage across the capacitor 18 is equal to the reference voltage $V_B$ and a time point where the square input pulse is initiated, that is, its rising edge is developed at the input terminal 28 and a time interval $\tau_2$ between the time point where the rising edge of the square input pulse is developed at the input terminal 28 and a time point where the discharged voltage across the capacitor 18 is equal to the reference voltage $V_B$ at the low level $V_{BL}$. In this case, the time interval $\tau_2$ is longer than the time interval $\tau_1$.

Assuming that the resistors 12, 14 and 32 respectively have magnitudes of resistance $R_{12}$, $R_{14}$ and $R_{32}$, then the square output pulse may be generated so as to have the time interval $\tau_1$ shorter than, equal to or longer than the time interval $\tau_2$ by properly selecting the magnitudes of resistances $R_{12}$, $R_{14}$ and $R_{32}$.

More specifically, assuming that the source voltage has a magnitude $V_{cc}$, the reference voltage $V_B$ is selectively set at its high and low levels $V_{BH}$ and $V_{BL}$ which are respectively expressed by:

$$V_{BH} = \frac{R_{14}}{R_{12} + R_{14}} V_{cc} \text{ and } V_{BL} \approx \frac{(R_{32}//R_{14})}{(R_{32}//R_{14}) + R_{12}} V_{cc}$$

where $R_{32}//R_{14}$ designates the magnitude of a parallel combination of the resistances $R_{14}$ and $R_{32}$. By properly selecting the magnitudes of resistance of the resistors 12, 14 and 32, so as to decrease the high level $V_{BH}$ of the reference voltage $V_B$, the time interval $\tau_1$ becomes longer while by increasing the high level $V_{BH}$, the time interval $\tau_1$ becomes shorter. The time interval $\tau_2$ can also be longer or shorter by respectively decreasing or increasing the low level $V_{BL}$.

From the foregoing it is seen that the magnitude of the time interval $\tau_1$ relative to the time interval $\tau_2$ can be selected at will.

In the arrangement of FIG. 2 with the components 32, 34 and 36 omitted, or the conventional waveform shaping circuit, however, the time interval $\tau_2$ is relatively short because the square output pulse terminates when the discharged voltage across the capacitor 18 is equal to the reference voltage $V_B$ at the high level $V_{BH}$ as will readily be understood from waveform (b) labelled $V_{BH}$ as shown in FIG. 2. Thus, the square output pulse has rising and falling edges which are bilaterally unsymmetrical with respect to the time point where the rising edge of the square input pulse is developed or where the falling edge thereof is developed, or where the output pulse is generated about the falling edge of the input pulse with the input terminals to the voltage comparator reversed in polarity from those illustrated. Accordingly, the conventional circuit has been disadvantageous in that the square output pulse cannot be generated at the desired timing.

In order to select the time intervals $\tau_1$ and $\tau_2$ at will, it has been already proposed to use a constant current circuit with each of the charging and discharging circuits for the capacitor. This measure has resulted in a great change in the pulse width of the output pulse relative to a variation in the source voltage.

Figure 3:
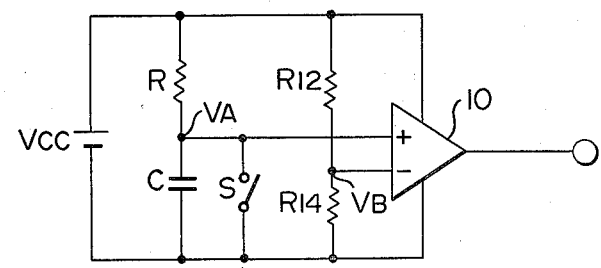
FIG. 3 is a circuit diagram useful in explaining the fact that a square output pulse from the arrangement shown in FIG. 1 is not affected by a variation in the source voltage.

However, the arrangement of FIG. 1 can generate a square output pulse having a pulse width which is not affected by a variation in the source voltage supplied to the source terminal 16 which will now be described in conjunction with FIG. 3, wherein there is illustrated that portion of the arrangement as shown in FIG. 1 principally serving to charge the capacitor 18 along with the voltage comparator 10. In the illustrated arrangement, the source voltage $V_{cc}$ is supplied across the voltage comparator 10, a series combination of resistances $R_{12}$ and $R_{14}$ respectively corresponding to the resistors 12 and 14, and a series combination of a resistance R and a capacitance C respectively corresponding to the charging resistor 20 and the capacitor 18 with a switch S connected across the capacitance C.

Assuming that the switch S is opened at the time point t=0, the voltage $V_A$ on the capacitance may be expressed by:

$$V_A = V_{cc}\left(1 - e^{-\frac{t}{RC}}\right)$$

Since the output pulse is initiated at the time point where the charged voltage $V_A$ across the capacitance C is equal to the reference voltage $V_B$ as determined by a ratio $R_{14}/(R_{12}+R_{14})$, $$V_{cc}\left(1 - e^{-\frac{t}{RC}}\right) = V_B = \frac{R_{14}}{R_{12} + R_{14}} V_{cc}$$

Thus, that time point t may be expressed by:

$$t = -RCl_n \frac{R_{14}}{R_{12} + R_{14}}$$

The above expression describes that the time point t is determined independently of the source voltage because the source voltage $V_{cc}$ disappears from the above expression for t.

Also, from the expression defining the discharge of the capacitance and the expression determining the reference voltage $V_{BL}$, it is seen that a time point where the discharged voltage across the capacitance C is equal to the reference low level $V_{BL}$ is independent of the source voltage $V_{cc}$.

Therefore, the output pulse has its pulse width as determined by the associated resistances independently of the source voltage.

It is noted that the conventional waveform shaping circuit as described above delivers a square output pulse having a pulse width which is independent of the source voltage.

From the foregoing it is seen that the present invention provides a waveform shaping circuit including means for varying a reference voltage supplied to a voltage comparator in response to a square input pulse. Therefore, the resulting square output pulse has a pulse width capable of being set at will. In other words, the output pulse has bilateral pulse width portions which are settable at will with respect to a time point where a rising edge of the input pulse is developed. Also, the output pulse has its pulse width stable with respect to a variation in the source voltage.

While the present invention has been illustrated and described in conjunction with a single preferred embodiment thereof, it is to be understood that numerous changes and modifications may be resorted to without departing from the spirit and scope of the present invention.

What is claimed is:

1. A waveform shaping circuit comprising a voltage comparator having a pair of inputs, one of said inputs being supplied with a reference voltage, the other of said inputs being supplied with a voltage across a capacitor which is charged in the absence of a square input pulse and which is discharged in the presence of said square input pulse so as to thereby produce a square output pulse from said voltage comparator, and further comprising a means which is responsive to said square input pulse to vary said reference voltage.

2. A waveform shaping circuit as claimed in claim 1, wherein said means for varying said reference voltage includes a resistor which is connected to the junction of two voltage dividing resistors which are serially interconnected across a source voltage so as to determine said reference voltage, and further includes a transistor having an emitter electrode which is connected to ground, a collector electrode which is connected to the first-mentioned resistor and a base electrode which is supplied with said square input pulse.

* * * * *